(12) United States Patent
Li et al.

(10) Patent No.: US 11,302,780 B1
(45) Date of Patent: Apr. 12, 2022

(54) FDSOI DEVICE STRUCTURE AND PREPARATION METHOD THEREOF

(71) Applicant: SHANGHAI HUALI INTEGRATED CIRCUIT CORPORATION, Shanghai (CN)

(72) Inventors: Zhonghua Li, Shanghai (CN); Runling Li, Shanghai (CN); Nan Li, Shanghai (CN); Jianghua Leng, Shanghai (CN); Tianpeng Guan, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 0 days.

(21) Appl. No.: 17/100,544

(22) Filed: Nov. 20, 2020

(30) Foreign Application Priority Data

Sep. 21, 2020 (CN) .......................... 202010992691.3

(51) Int. Cl.
*H01L 29/08* (2006.01)
*H01L 29/66* (2006.01)
*H01L 29/417* (2006.01)

(52) U.S. Cl.
CPC ...... *H01L 29/0847* (2013.01); *H01L 29/4175* (2013.01); *H01L 29/66613* (2013.01)

(58) Field of Classification Search
CPC ............. H01L 29/1083; H01L 29/0847; H01L 29/4175; H01L 29/66613; H01L 29/1054; H01L 29/7838
See application file for complete search history.

(56) References Cited

U.S. PATENT DOCUMENTS

| 7,012,007 B1* | 3/2006 | Goo ..................... H01L 29/1054 438/296 |
| 2013/0193514 A1* | 8/2013 | Loubet ..................... H01L 21/84 257/347 |
| 2016/0276451 A1* | 9/2016 | Golanski ................. H01L 27/12 |
| 2018/0006129 A1* | 1/2018 | Xing ................. H01L 29/42376 |
| 2019/0221660 A1* | 7/2019 | Dasgupta ............ H01L 29/2003 |
| 2020/0035710 A1* | 1/2020 | Gocho ..................... H01L 21/84 |
| 2020/0044029 A1* | 2/2020 | Mulfinger ......... H01L 29/78654 |
| 2020/0083253 A1* | 3/2020 | Cheng ............. H01L 21/823462 |
| 2021/0193643 A1* | 6/2021 | Hsu ..................... H01L 29/0847 |

* cited by examiner

*Primary Examiner* — Didarul A Mazumder
*Assistant Examiner* — Wasiul Haider
(74) *Attorney, Agent, or Firm* — Alston & Bird LLP

(57) ABSTRACT

An FDSOI device structure and its fabrication method are disclosed. The device includes a silicon substrate; a buried oxide layer on the silicon substrate; a SiGe channel on the buried oxide layer, wherein the SiGe channel has a thickness in a range of 60-100 Å; a silicon layer on the SiGe channel layer; a metal gate disposed on the silicon layer, and sidewalls attached to both sides of the metal gate; and source-drain regions disposed on the silicon layer at both sides of the metal gate, wherein the source-drain regions are built in raised SiGe layers. The invention discloses a channel forming method for the FDSOI device, the method includes making a SiGe layer and an epitaxially grown silicon layer. This channel has avoided issues such as the low stress of a silicon channel and the Ge diffusion into the gate dielectric as occurred in the conventional process, thereby improving the reliability and performance of the FDSOI device.

15 Claims, 4 Drawing Sheets

FDSOI DEVICE STRUCTURE AND PREPARATION METHOD THEREOF

CROSS-REFERENCES TO RELATED APPLICATIONS

This application claims priority to Chinese patent application No. CN 202010992691.3, filed on Sep. 21, 2020 at CNIPA, and entitled "FDSOI DEVICE STRUCTURE AND PREPARATION METHOD THEREOF", the disclosure of which is incorporated herein by reference in entirety.

TECHNICAL FIELD

The present application relates to the field of semiconductor technologies, in particular to an FDSOI device structure and a preparation method thereof.

BACKGROUND

Currently, in the advanced note such as 22 nm, the PMOS devices for Fully Depleted Silicon-on-Insulator (FDSOI) generally adopt a silicon channel-metal gate process, where the channel is a silicon channel and the gate is a high-k metal gate. The channel in this process is a silicon channel, and the compressive stress in the channel needs to be increased. Therefore, in order to increase the compressive stress in the channel, the silicon channel is replaced with a silicon germanium (SiGe) channel, and a process of SiGe channel plus a metal gate is employed, which significantly increases the compressive stress in the channel, thereby increasing the hole mobility for PMOS.

However, the germanium in the SiGe channel in the current technology may diffuse into the gate dielectric, thereby reducing reliability and performance of the PMOS devices.

Therefore, it is necessary to provide a new device structure and manufacturing method to solve the above problem.

BRIEF SUMMARY

According to one embodiment of the current disclosure, an FDSOI device structure, comprising at least: a silicon substrate; a buried oxide layer disposed on the silicon substrate; a SiGe channel disposed on the buried oxide layer, wherein a thickness of the SiGe channel is in the range of 60-100 Å; a silicon layer disposed on the SiGe channel layer; a metal gate disposed on the silicon layer, wherein sidewalls are attached to both sides of the metal gate; and a source region and a drain region disposed on the silicon layer and arranged at both sides of the metal gate, wherein the source and drain regions are arranged in a raised SiGe layer.

In some examples, the thickness of the buried oxide layer is in the range of 100-300 Å.

In some examples, the thickness of the silicon layer is in the range of 2-20 Å

In some examples, the metal gate comprises a first stack structure and a second stack structure disposed on the first stack structure, wherein the first stack structure comprises of, sequentially arranged in a low to high order, a gate oxide layer structure, a high-k dielectric layer structure, and a titanium nitride layer structure, and wherein the second stack structure comprises, sequentially arranged in a low to high order, a TaN layer, a TiN layer, a TiAl layer, and an aluminum layer.

In some examples, a thickness of the gate oxide layer structure is in a range of 6-15 Å.

In some examples, a thickness of the high-k dielectric layer structure is in a range of 15-30 Å.

In some examples, a thickness of the TiN layer structure is in a range of 15-30 Å.

In some examples, the attached sidewalls comprise SiCN structures or SiON structures.

The disclosure further includes a method to make a FDSOI device, the method comprises at least the following steps:

step 1: providing the silicon substrate, wherein the buried oxide layer is disposed on the silicon substrate, and the SOI layer is disposed on the buried oxide layer;

step 2: forming the SiGe layer on the SOI layer by epitaxial deposition;

step 3: oxidizing the SiGe layer by high-temperature diffusion, so that Ge in the SiGe layer is driven into the SOI layer to form the SiGe channel with the thickness in the range of 60-100 Å, wherein the SiGe layer is changed to the $SiO_2$ layer;

step 4: removing the $SiO_2$ layer;

step 5: epitaxially growing the silicon layer on an upper surface of the SiGe channel;

step 6: sequentially depositing the gate oxide layer structure, the high-k dielectric layer structure, and the titanium nitride layer structure on the silicon layer;

step 7: forming an amorphous silicon layer on the titanium nitride layer, depositing a hard mask layer on the amorphous silicon layer, then patterning a gate by photolithography, followed by sequentially etching the hard mask layer, the amorphous silicon layer, the titanium nitride layer, the high-k dielectric layer, and the gate oxide layer structure, to form the first stack structure, wherein the first stack structure comprises, sequentially arranged from low to upper in the order of, the gate oxide layer structure, the high-k dielectric layer structure, and the titanium nitride layer structure; forming an amorphous silicon layer structure disposed on the first stack structure and disposing a hard mask layer structure on the amorphous silicon layer structure; and forming sidewalls of inner spacer and outer hard mask on side walls of the first stack layer and the amorphous silicon layer structure;

step 8: epitaxially growing the source region and the drain region on the silicon layer at both sides of the amorphous silicon layer structure, wherein the source region and drain region are in the raised SiGe layer;

step 9: removing the hard mask layer structure and the amorphous silicon layer structure, and forming a groove in the sidewalls of inner spacer on the first stack layer;

step 10: depositing sequentially in the order of the TaN layer, the TiN layer, the TiAl layer, and the aluminum layer to fill the groove, to form the second stack structure, wherein the first and second stack structures and their sidewalls form the metal gate; and step 11: planarizing the aluminum layer, followed by performing metal interconnection.

In some examples, in step 1, an native oxide is formed on an upper surface of the SOI layer; and wherein in step 2, forming the SiGe layer by epitaxial deposition comprises steps of: first removing the native oxide on the upper surface of the SOI layer using at least one of HF, SiCoNi™, HCL, and $H_2$, and then growing the SiGe layer on the SOI layer with a Ge concentration in a range of 20%-60% in situ, wherein a thickness of the SiGe layer is in a range of 50-400 Å.

In some examples, a reaction temperature of the high-temperature diffusion in step 3 is in a range of 1000-2000° C., and the oxidation mode of the high-temperature diffusion is alternately performing oxidation and annealing, wherein the annealing is carried out in a nitrogen environment.

In some examples, a method for removing the $SiO_2$ layer in step 4 comprises removing the $SiO_2$ layer by wet etching with HF or removing the $SiO_2$ layer by dry etching.

In some examples, in step 4, after the $SiO_2$ layer is removed so an upper surface of the SiGe channel is exposed, the upper surface of the SiGe channel is oxidized to form an oxide; and wherein in step 5, before the silicon layer is epitaxially grown on the upper surface of the SiGe channel, the oxide on the upper surface of the SiGe channel is first removed.

In some examples, in step 5, before the silicon layer is epitaxially grown on the upper surface of the silicon Ge channel, the oxide on the upper surface of the SiGe channel is removed using at least one of HF, SiCoNi™, HCl, and $H_2$.

In some examples, in step 5, the silicon layer is grown on the upper surface of the SiGe channel by in-situ epitaxial growth, and a thickness of the silicon layer is in the range of 2-20 Å.

In some examples, the mode of depositing the gate oxide layer structure on the silicon layer in step 6 is in-situ steam generation, wherein a thickness of the deposited gate oxide layer structure is in a range of 6-15 Å; wherein the deposited high-k dielectric layer is $HfO_2$ or $HfLaO_2$, and the thickness of the high-k dielectric layer is in a range of 15-30 Å; and wherein the thickness of the deposited titanium nitride layer is 15-30 Å.

In some examples, a concentration of Ge in the raised SiGe layer epitaxially grown in step 8 is in the range of 20%-50%, and the raised SiGe layer includes boron at a concentration of $1*10^{19}$-$1*10^{21}$ $cm^{-3}$; and a thickness of the raised SiGe layer has a range in 200-400 Å.

As stated above, the FDSOI device and fabrication method of the present application have the following benefits: in the disclosed FDSOI device, the channel includes a stack structure of a SiGe layer and a silicon epitaxial layer, which avoids the low stress of a silicon-only channel in the conventional device and the Ge diffusion in a SiGe channel further into a gate dielectric in the conventional device, thereby improving the reliability and performance of the FDSOI device.

DETAILED DESCRIPTION OF THE DISCLOSURE

The implementations of the present application are described below using specific examples. Those skilled in the art could easily understand other advantages and effects of the present application from the content disclosed in the specification. The present application can also be implemented or applied in other different specific settings, and various details in the specification can also be modified or changed based on different viewpoints and applications without departing from the spirit of the present application.

It should be noted that FIGS. 1-10 provided in the embodiments only illustrate the basic concept of the present application in a schematic manner, so the figures only show the components related to the present application, but are not drawn according to the number, shape and size of the components in actual implementations. The pattern, number, and ratio of each component in actual implementations can be changed randomly, and the component layout pattern may be more complicated.

Figure 10:
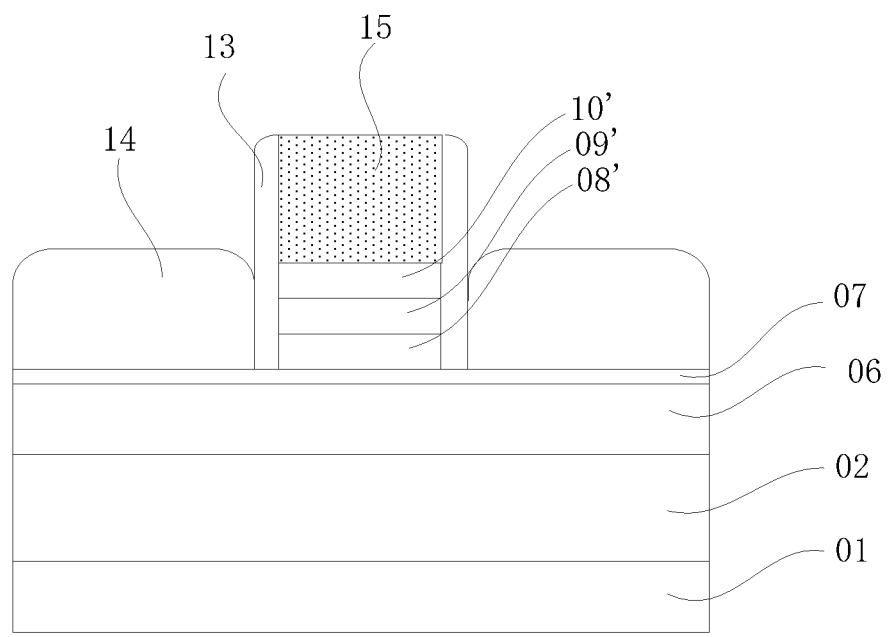
FIG. 10 illustrates a schematic cross sectional view of the FDSOI device structure according to an embodiment of the present disclosure.

The present embodiment provides an FDSOI device structure, which includes at least: a silicon substrate, a buried oxide layer located on the silicon substrate, a SiGe channel located on the buried oxide layer, wherein the thickness of the SiGe channel is from 60 to 100 Å, a silicon layer located on the SiGe channel layer, a metal gate located on the silicon layer, and one sidewall attached to another side wall of the metal gate, and a source and a drain regions in the silicon layer located at both sides of the metal gate, wherein the source and drain regions are disposed in raised SiGe layers. Referring to FIG. 10, which is a schematic structural diagram of an FDSOI device structure according to an embodiment of the present application, the FDSOI device structure in this embodiment includes: a silicon substrate 01, a buried oxide layer 02 located on the silicon substrate 01, an exemplary thickness range of the buried oxide layer is 100-300 Å, a SiGe channel 06 located on the buried oxide layer 02, wherein the thickness range of the SiGe channel 06 is 60-100 Å, a silicon layer 07 located on the SiGe channel layer 06, an exemplary thickness range of the silicon layer 07 is 2-20 Å, a metal gate located on the silicon layer 07 and sidewalls 13 attached to the side walls of the metal gate, wherein an exemplary metal gate includes a first stack structure 08', 09', 10' and a second stack structure 15 located on the first stack structure, the first stack structure consists of a gate oxide layer structure 08', a high-k dielectric layer structure 09', and a titanium nitride layer structure 10' that are sequentially disposed from lower gate oxide layer structure 08' to the upper titanium nitride layer structure 10', the second stack structure comprises a tantalum nitride (TaN) layer, a titanium nitride (TiN) layer, a titanium aluminide (TiAl) layer, and an aluminum layer that are sequentially stacked from lower to upper layers, the exemplary thickness range of the gate oxide layer is 6-15 Å and the thickness range of the high-k dielectric layer structure is 15-30 Å, and the exemplary thickness range of the TiN layer structure is 15-30 Å. The source-drain regions 14 located in the layer of raised SiGe on the silicon layer 07 are disposed at both sides of the metal gate.

The present application further provides a method for preparing the FDSOI device, and the method includes at least the following steps:

step 1: providing a silicon substrate, wherein a buried oxide layer is disposed on the silicon substrate, and an SOI layer is disposed on the buried oxide layer;

step 2: forming a SiGe layer on the SOI layer by means of epitaxial deposition;

step 3: oxidizing the SiGe layer by means of high-temperature diffusion in oxygen, so that germanium atoms in the SiGe layer diffuse into the SOI layer to form a SiGe channel with a thickness in the range of 60-100 Å, wherein the SiGe layer is formed inside a $SiO_2$ layer;

step 4: removing the $SiO_2$ layer;

step 5: epitaxially growing a silicon layer on an upper surface of the SiGe channel;

step 6: sequentially depositing a gate oxide layer, a high-k dielectric layer, and a titanium nitride layer 10' on the silicon layer;

step 7: forming an amorphous silicon layer on the titanium nitride layer, depositing a hard mask layer on the amorphous silicon layer, then defining a gate pattern by means of photolithography followed by etching the hard mask layer, the amorphous silicon layer, the titanium nitride layer, the high-k dielectric layer, and the gate oxide layer sequentially, to form a first stack structure consisting of a gate oxide layer structure, a high-k dielectric layer structure, and a titanium nitride layer structure that are sequentially stacked from lower to upper layers; forming an amorphous silicon layer structure located on the first stack structure and a hard mask layer structure located on the amorphous silicon layer structure, forming sidewalls as inner spacers and a hard mask as an outer layer on side walls of the first stack layer and the amorphous silicon layer structure;

step 8: epitaxially growing source-drain regions on the silicon layer at both sides of the amorphous silicon layer structure, wherein the source-drain regions are in a raised SiGe;

step 9: removing the hard mask layer structure and the amorphous silicon layer structure, and forming a groove in the sidewalls of spacers on the first stack layer;

step 10: sequentially depositing a TaN layer, a TiN layer, a TiAl layer, and an aluminum layer to fill the groove, and forming a second stack structure, wherein the first and second stack structures and the sidewalls form a metal gate; and step 11: planarizing the aluminum layer, followed by performing metal interconnection.

Referring to FIGS. 1-9, which illustrate the structures following each step of the method for fabricating the FDSOI device according to the embodiment of the disclosure. The method includes the following steps.

Step 1: A silicon substrate 01 is provided, a buried oxide layer 02 is disposed on the silicon substrate 01, and a silicon-on-insulator (SOI) layer 03 is disposed on the buried oxide layer 02, referring to FIG. 1, which is a schematic structural diagram of the substrate for a FDSOI device which includes the buried oxide layer and SOI layer on the silicon substrate according to one embodiment of the present disclosure.

Step 2: A SiGe layer 04 is formed on the SOI layer 03 by means of epitaxial deposition, referring to FIG. 2, a schematic structure diagram including a SiGe layer on the SOI layer according to one embodiment of the present disclosure. An native oxide is grown on the surface of the SOI layer post step 1, that is because an upper surface of the SOI layer grows an native oxide layer when it is exposed to the air. Therefore, according to this embodiment, forming the SiGe layer 04 in step 2 includes steps of: first removing the native oxide on the top surface of the SOI layer using at least one of HF, SiCoNi, HCL, and $H_2$, second growing the SiGe layer 04 with a Ge concentration in the range of 20%-60% in situ on the SOI layer, wherein the thickness of the SiGe layer 04 is 50-400 Å.

Step 3: The SiGe layer 04 is oxidized by high-temperature diffusion process, so that Ge in the SiGe layer 04 is driven into the SOI layer to form a SiGe channel 06 with a thickness in the range of 60-100 Å, wherein the SiGe layer 04 is formed into a $SiO_2$ layer 05, referring to FIG. 3, a schematic structural diagram including a SiGe channel and a $SiO_2$ layer according to one embodiment of the present disclosure.

Figure 1:
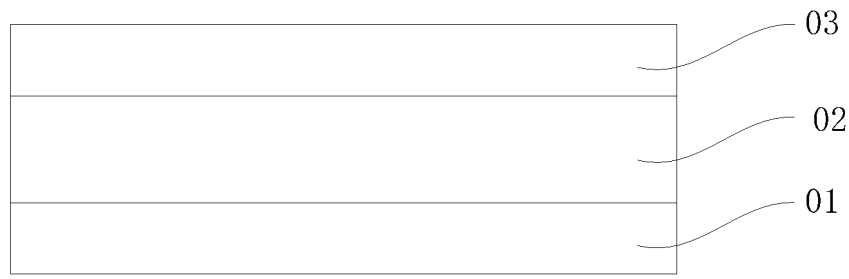
FIG. 1 illustrates a schematic structural diagram of a substrate for FDSOI device which includes a buried oxide layer and an SOI layer on the silicon substrate according to one embodiment of the present disclosure.
Figure 2:
FIG. 2 illustrates a schematic structural diagram including a SiGe layer on the SOI layer according to one embodiment of the present disclosure.
Figure 3:
FIG. 3 illustrates a schematic structural diagram including a SiGe channel and a $SiO_2$ layer according to one embodiment of the present disclosure.
Figure 4:
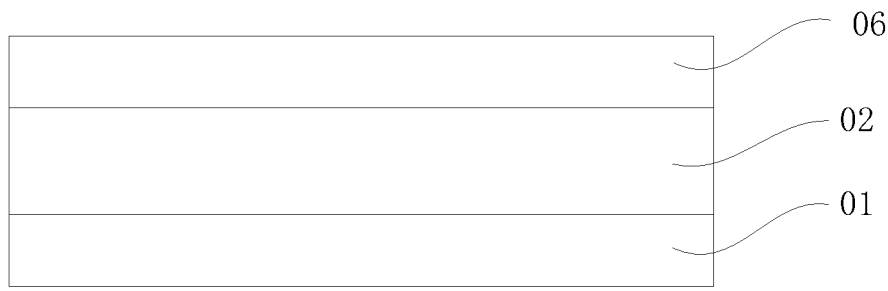
FIG. 4 illustrates the schematic structure after the $SiO_2$ layer is removed from above the SiGe channel according to one embodiment of the present disclosure.
Figure 5:
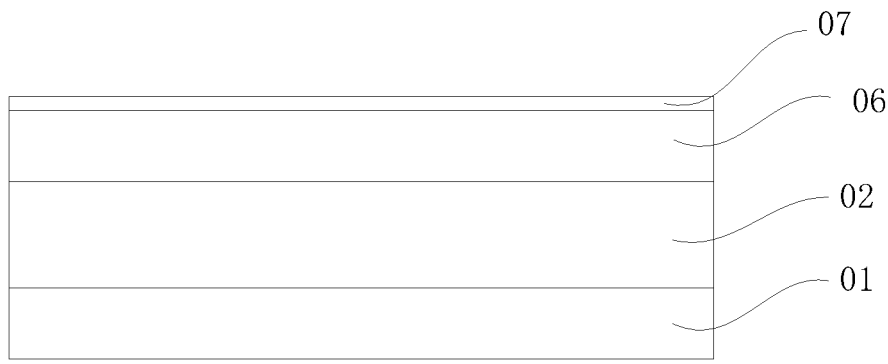
FIG. 5 illustrates the structure after a silicon layer is deposited on the SiGe channel according to one embodiment of the present disclosure.
Figure 6:
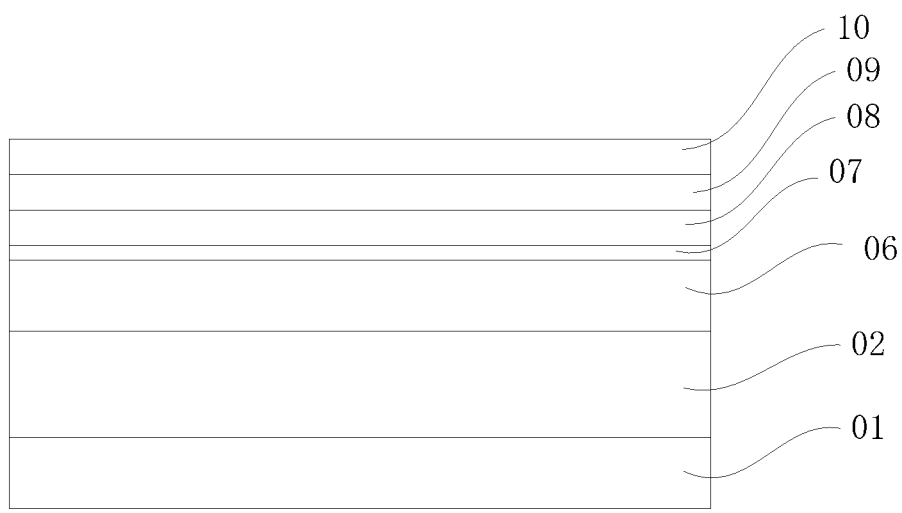
FIG. 6 illustrates the structure after a gate oxide layer, a high-k dielectric layer, and a titanium nitride layer are disposed on the silicon layer according to one embodiment of the present disclosure.

In an example, the reaction temperature of the high-temperature diffusion furnace in step 3 is in the range of 1000° C.-2000° C., and the oxidation method of the high-temperature diffusion is performing diffusion and annealing alternately, wherein the annealing process is carried out in a nitrogen environment. Step 3 is performed in a high-temperature environment of 1000° C.-2000° C. to oxidize the SiGe layer 04, in addition, the Ge in the SiGe layer 04 undergoes high temperature oxidation and annealing processes in a number of alternating cycles before diffusing into the silicon-on-insulator (SOI) layer 03 below the SiGe layer 04, thereby forming the SiGe channel 06. After all germanium element (Ge) in the SiGe layer fully diffused into the SOI layer, there will be only oxidized silicon ($SiO_2$) remaining, as shown in FIG. 3, thereby forming the $SiO_2$ layer 05 located above the SiGe channel 06.

Step 4: The $SiO_2$ layer 05 is removed, referring to FIG. 4, the schematic structure after the $SiO_2$ layer is removed from above the SiGe channel according to one embodiment of the present disclosure. As an example of the present application, a method for removing the $SiO_2$ layer in step 4 in this embodiment includes removing the $SiO_2$ layer 05 by wet etching with hydrogen fluoride (HF) or by dry etching.

Step 5: A silicon layer is epitaxially grown on an upper surface of the SiGe channel 06, referring to FIG. 5, which is the structure after a silicon layer is deposited on the SiGe channel according to one embodiment of the present disclosure. In an example, in step 5 in the embodiment, before the silicon layer 07 is epitaxially grown on the upper surface of the SiGe channel 06, the native oxide on the upper surface of the SiGe channel 06 is first removed using at least one of HF, SiCoNi™ (a remote plasma assisted dry etch process), hydrochloric acid (HCL), and $H_2$. In an example, in step 4, after the $SiO_2$ layer 05 is removed, the upper surface of the SiGe channel 06 is exposed, and the upper surface of the SiGe channel 06 is oxidized to form SiOx; and in step 5, before the silicon layer is epitaxially grown on the upper surface of the SiGe channel, the oxide on the upper surface of the SiGe channel 06 is removed ahead of time.

In another example, in step 5, the silicon layer is grown on the upper surface of the SiGe channel by means of in-situ epitaxial growth, and the thickness of the silicon layer is in the range of 2-20 Å. That is to say, in this embodiment, after the oxide on the upper surface of the SiGe channel 06 is removed, then the silicon layer 07 with a thickness ranging 2-20 Å is grown on the upper surface of the SiGe channel by means of in-situ epitaxial growth.

Step 6: A gate oxide layer, a high-k dielectric layer, and a titanium nitride layer are deposited on the silicon layer sequentially, referring to FIG. 6, which shows the structure after a gate oxide layer, a high-k dielectric layer, and a titanium nitride layer are disposed on the silicon layer according to one embodiment of the present disclosure. In step 6, the gate oxide layer 08, the high-k dielectric layer 09, and the titanium nitride layer 10 are deposited on the silicon layer 07 sequentially. In an example, the method of depositing the gate oxide layer 08 on the silicon layer 07 in step 6 is by in-situ steam generation, and the thickness of the deposited gate oxide layer 08 is in the range of 6-15 Å; the deposited high-k dielectric layer 09 is hafnium oxide ($HfO_2$) or hafnium Lanthanum oxide ($HfLaO_2$), and the thickness of the high-k dielectric layer 09 is in the range of 15-30 Å; and the thickness of the deposited titanium nitride layer 10 is in the range of 15-30 Å.

Figure 7:
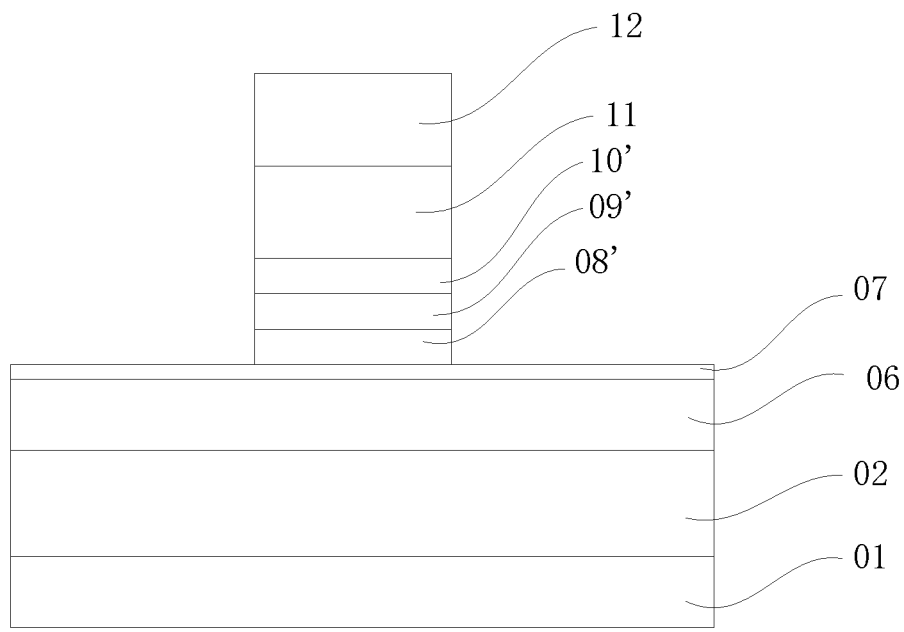
FIG. 7 illustrates the structure after a first stack structure, an amorphous silicon layer structure, and a hard mask layer structure are disposed according to one embodiment of the present disclosure.
Figure 8:
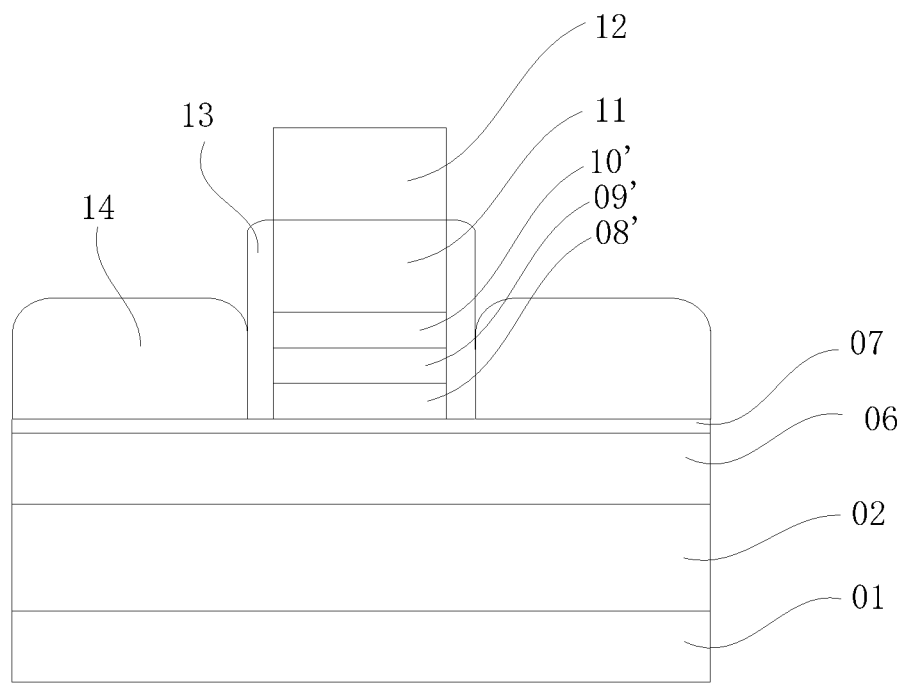
FIG. 8 illustrates a schematic structural diagram of forming a source and drain regions and forming sidewalls of inner spacer and outer hard mask on a side wall of the amorphous silicon layer structure according to one embodiment of the present disclosure.
Figure 9:
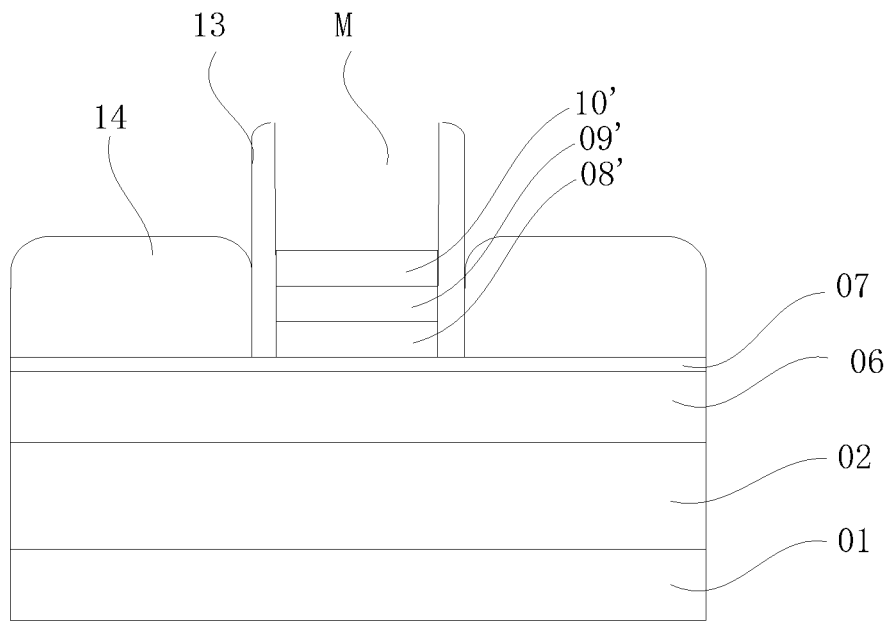
FIG. 9 illustrates the structure after removing the amorphous silicon layer structure to form a groove according to one embodiment of the present disclosure.

For step 7, reference is made to FIG. 7, which shows a structure after a first stack structure, an amorphous silicon layer structure, and a hard mask layer structure are disposed according to one embodiment of the present disclosure. In Step 7: An amorphous silicon layer is formed on the titanium nitride layer, a hard mask layer is deposited on the amorphous silicon layer, then a gate pattern is defined by photolithography and etch. Step 7 also includes forming the hard mask layer, the amorphous silicon layer, the titanium nitride layer, the high-k dielectric layer, and the gate oxide layer, all of which are sequentially etched to form a first stack structure including a gate oxide layer structure 08', a high-k dielectric layer structure 09', and a titanium nitride layer structure 10' that are stacked up sequentially, an amorphous silicon layer structure 11 is disposed on the first stack structure and a hard mask layer structure 12 disposed on the amorphous silicon layer structure 11. Sidewalls are formed on the side walls of the first stack layer and the amorphous silicon layer structure 11, referring to FIG. 8, which is a schematic structural diagram of forming the source-drain regions and forming sidewalls of the inner spacer and outer hard mask on side walls of the amorphous silicon layer structure according to the embodiment. The sidewall 13 is attached to the side walls of the first stack layer having 08', 09', 10', and the amorphous silicon layer structure 11.

Step 8: The source-drain regions are epitaxially grown on the silicon layer at both sides of the amorphous silicon layer structure, wherein the source-drain regions are formed in a raised SiGe layer, referring to FIG. 8, the source-drain regions 14 are in a raised SiGe layer, the first stack layer and the amorphous silicon layer structure will form the metal gate, and the source-drain regions will be disposed on both sides of the metal gate.

Step 9: The hard mask layer structure and the amorphous silicon layer structure are removed, and a groove is formed in the sidewalls on the first stack layer, referring to FIG. 9, which illustrates the structure after removing the amorphous silicon layer structure to form a groove according to one embodiment of the present disclosure. In step 9, the amorphous silicon layer structure on the first stack layer is removed to form the groove M. In an example, the concentration of germanium in the raised SiGe, epitaxially grown in step 8 in this embodiment, is 20%-50%, and the raised SiGe layer is doped with boron at a concentration of $1*10^{19}$-$1*10^{21}$ $cm^{-3}$; and the thickness of the raised SiGe layer is in the range of 200-400 Å.

Step 10: A TaN layer, a TiN layer, a TiAl layer, and an aluminum layer are sequentially deposited to fill the groove and form a second stack structure above the first stack, thus the metal gate is formed of the first and second stack structures and the sidewalls, referring to FIG. 10, which shows the cross sectional view of the FDSOI device structure according to an embodiment of the present disclosure. The second stack structure comprises a TaN layer on the first stack layer, a TiN layer on the TaN layer, a TiAl layer on the TiN layer, and an aluminum layer on the TiAl layer. The metal gate according to the embodiment includes the first stack layer, the second stack structure, and their sidewalls.

Step 11: The aluminum layer is planarized then metal interconnection is performed.

In conclusion, in a manufacturing process of an FDSOI device of the present application, a stack structure of a SiGe layer and a silicon epitaxial layer is used as a channel, avoiding the low stress of a silicon channel in the conventional process and the diffusion of Ge in a SiGe channel to a gate dielectric in the conventional process, and thereby improving the reliability and performance of the device. Therefore, the present application effectively overcomes various shortcomings in the prior art and thus has a high industrial utilization value.

It should be understood that the examples and embodiments described herein are for illustrative purposes only and that various modifications or changes in light thereof will be suggested to persons skilled in the art and are to be included within the spirit and purview of this application.

What is claimed is:

1. A method for making a FDSOI device, wherein the FDSOI device comprises:
   a silicon substrate;
   a buried oxide layer disposed on the silicon substrate;
   a SiGe channel disposed on the buried oxide layer, wherein a thickness of the SiGe channel is in a range of 60-100 Å;
   a silicon layer disposed on the SiGe channel;
   a metal gate disposed on the silicon layer, wherein sidewalls are attached to both sides of the metal gate; and
   a source region and a drain region disposed on the silicon layer and arranged at both sides of the metal gate, wherein the source and drain regions are arranged in a raised SiGe layer;
   wherein the method for making the FDSOI device comprises following steps:
   step 1: providing the silicon substrate, wherein the buried oxide layer is disposed on the silicon substrate, and a SOI layer is disposed on the buried oxide layer;
   step 2: forming a SiGe layer on the SOI layer by epitaxial deposition;
   step 3: oxidizing the SiGe layer by high-temperature diffusion, so that Ge in the SiGe layer is driven into the SOI layer to form the SiGe channel with a thickness in a range of 60-100 Å, wherein the SiGe layer is changed to an $SiO_2$ layer;
   step 4: removing the $SiO_2$ layer;
   step 5: epitaxially growing the silicon layer on an upper surface of the SiGe channel;
   step 6: sequentially depositing a gate oxide layer structure, a high-k dielectric layer structure, and a titanium nitride layer structure on the silicon layer;

step 7: forming an amorphous silicon layer on the titanium nitride layer, depositing a hard mask layer on the amorphous silicon layer, then patterning a gate by photolithography, followed by sequentially etching the hard mask layer, the amorphous silicon layer, to form a first stack structure, wherein the first stack structure comprises, sequentially arranged from low to upper in an order of, the gate oxide layer structure, the high-k dielectric layer structure, and the titanium nitride layer structure;

forming sidewalls of inner spacer on side walls of the first stack layer and the amorphous silicon layer structure;

step 8: epitaxially growing the source region and the drain region on the silicon layer at both sides of the amorphous silicon layer structure, wherein the source region and drain region are in the SiGe layer;

step 9: removing the hard mask layer structure and the amorphous silicon layer structure, and forming a groove in the sidewalls of inner spacer on the first stack layer;

step 10: depositing sequentially in the order of a TaN layer, a TiN layer, a TiAl layer, and an aluminum layer to fill the groove, to form a second stack structure, wherein the first stack structure and the second stack structure and their sidewalls form the metal gate; and step 11: planarizing the aluminum layer, followed by performing metal interconnection.

2. The method for making the FDSOI device according to claim 1, wherein in step 1, an native oxide is formed on an upper surface of the SOI layer; and wherein in step 2, forming the SiGe layer by epitaxial deposition comprises steps of: first removing the native oxide on the upper surface of the SOI layer using at least one of HF, SiCoNi, HCL, and $H_2$, and then growing the SiGe layer on the SOI layer with a Ge concentration in a range of 20%-60% in situ, wherein a thickness of the SiGe layer is in a range of 50-400 Å.

3. The method for making the FDSOI device according to claim 1, wherein a reaction temperature of the high-temperature diffusion in step 3 is in a range of 1000-2000° C., and the oxidation mode of the high-temperature diffusion is alternately performing oxidation and annealing, wherein the annealing is carried out in a nitrogen environment.

4. The method for making the FDSOI device according to claim 1, wherein a method for removing the $SiO_2$ layer in step 4 comprises removing the $SiO_2$ layer by wet etching with HF or removing the $SiO_2$ layer by dry etching.

5. The method for making the FDSOI device according to claim 1, wherein in step 4, after the $SiO_2$ layer is removed so an upper surface of the SiGe channel is exposed, the upper surface of the SiGe channel is oxidized to form an oxide; and wherein in step 5, before the silicon layer is epitaxially grown on the upper surface of the SiGe channel, the oxide on the upper surface of the SiGe channel is first removed.

6. The method for making the FDSOI device according to claim 5, wherein in step 5, before the silicon layer is epitaxially grown on the upper surface of the SiGe channel, the oxide on the upper surface of the SiGe channel is removed using at least one of HF, SiCoNi, HCl, and $H_2$.

7. The method for making the FDSOI device according to claim 1, wherein in step 5, the silicon layer is grown on the upper surface of the SiGe channel by in-situ epitaxial growth, and a thickness of the silicon layer is in a range of 2-20 Å.

8. The method for making the FDSOI device according to claim 1, wherein a mode of depositing the gate oxide layer structure on the silicon layer in step 6 is in-situ steam generation, wherein a thickness of the gate oxide layer structure is in a range of 6-15 Å; wherein the high-k dielectric layer is $HfO_2$ or $HfLaO_2$, and a thickness of the high-k dielectric layer is in a range of 15-30 Å; and wherein a thickness of the titanium nitride layer is 15-30 Å.

9. The method for making the FDSOI device according to claim 1, wherein a concentration of Ge in the raised SiGe layer epitaxially grown in step 8 is in a range of 20%-50%, and the raised SiGe layer includes boron at a concentration of $1*10^{19}$-$1*10^{21}$ $cm^{-3}$; and a thickness of the raised SiGe layer has a range in 200-400 Å.

10. The method for making the FDSOI device according to claim 1, wherein a thickness of the buried oxide layer is in a range of 100-300 Å.

11. The method for making the FDSOI device according to claim 1, wherein a thickness of the silicon layer is in a range of 2-20 Å.

12. The method for making the FDSOI device according to claim 1, wherein a thickness of the gate oxide layer structure is in a range of 6-15 Å.

13. The method for making the FDSOI device according to claim 1, wherein a thickness of the high-k dielectric layer structure is in a range of 15-30 Å.

14. The method for making the FDSOI device according to claim 1, wherein a thickness of the TiN layer structure is in a range of 15-30 Å.

15. The method for making the FDSOI device according to claim 1, wherein the sidewalls of the inner spacer comprise SiCN structures or SiON structures.

* * * * *